United States Patent [19]

Nishimura et al.

[11] Patent Number: 5,386,189
[45] Date of Patent: Jan. 31, 1995

[54] IC MEASURING METHOD

[75] Inventors: Kazuhiro Nishimura; Kiyotoshi Ueda, both of Itami, Japan

[73] Assignee: Mitsubishi Denki Kabushiki Kaisha, Tokyo, Japan

[21] Appl. No.: 916,719

[22] Filed: Jul. 22, 1992

[30] Foreign Application Priority Data

Jul. 23, 1991 [JP] Japan .................................. 3-182444

[51] Int. Cl.6 .............................................. G01R 31/28
[52] U.S. Cl. ................... 324/158.1; 324/73.1
[58] Field of Search ............... 324/73.1, 158 R, 158.1, 324/750; 371/22.3, 22.5, 22.6, 15.1, 16.1; 437/8; 364/550.1

[56] References Cited

U.S. PATENT DOCUMENTS

| | | | |
|---|---|---|---|
| 4,300,207 | 11/1981 | Eivers et al. | 324/73.1 |
| 4,402,055 | 8/1983 | Lloyd et al. | 324/73.1 |
| 4,404,519 | 9/1983 | Westcott | 324/73.1 |
| 4,481,627 | 11/1984 | Beauchesne et al. | 371/22.6 |
| 4,639,664 | 1/1987 | Chiu et al. | 324/158 MG |
| 4,719,411 | 1/1988 | Buehler | 324/158 R |
| 4,724,379 | 2/1988 | Hoffman | 371/22.6 |
| 4,764,926 | 8/1988 | Knight et al. | 371/22.3 |
| 4,799,009 | 1/1989 | Tada et al. | 324/158 P |
| 4,926,363 | 5/1990 | Nix | 324/73.1 |
| 5,025,205 | 6/1991 | Mydill et al. | 324/73.1 |
| 5,025,210 | 6/1991 | Yaguchi | 324/73.1 |
| 5,034,685 | 7/1991 | Leedy | 324/73.1 |
| 5,126,953 | 6/1992 | Berger et al. | 324/73.1 |

Primary Examiner—Vinh Nguyen
Attorney, Agent, or Firm—Leydig, Voit & Mayer

[57] ABSTRACT

An IC measuring method including positioning a plurality of ICS, each having a plurality of circuit blocks performing different functions, selecting different circuit blocks in each of the plurality of ICs, measuring the test results from each of the selected circuit blocks, and selecting a different circuit block in each of the plurality of ICs for the next measurement. The circuit block selection is controlled by a matrix circuit or by physically shifting the positions of the ICs.

6 Claims, 6 Drawing Sheets

IC MEASURING METHOD

BACKGROUND OF THE INVENTION

1. Field of the Invention

The present invention relates to a measuring method for testing semiconductor integrated circuits (referred to as ICs hereinafter).

2. Description of the Related Art

A conventional IC measuring method will be described with reference to FIG. 6. An IC 1 has sixty-four external leads 15. The external leads 15 are connected through corresponding cables 16 to a test head 5 in a measuring apparatus 7. The test head 5 includes at least sixty-four pin-electronic elements 17 each of which has a comparator 18 and a driver 19. Each of the external leads 15 of the IC 1 is connected to a corresponding pin-electronic 17. The measuring apparatus 7 further comprises a controller 8 which is connected to the test head 5 by cables 6.

When the IC 1 is tested, a power source 20 in the controller 8 supplies power through the cables 6, the test head 5 and the cable 16 to power-receiving external leads 15 of the IC 1. Then, a test pattern generator 22 in the controller 8 sends Hi-level and Lo-level signals to the external leads 15 which are related to the test. The output signals from the IC 1 are measured by a measuring unit 21 in the controller 8.

Usually, several tens of different functional tests are performed for one IC 1, and different sets of external leads 15 are used to receive signals for different functional tests. The external leads 15 to which signals are not sent are held at a predetermined electric potential.

In the conventional art, all the external leads 15 of an IC 1 to be tested are connected to the corresponding pin-electronic elements 17 in the test head 5, as described above. Thus, the test head 5 have at least as many pin-electronic elements 17 as the external leads 15 of an IC 1. Therefore, for testing a large IC halving a large number of external leads, a measuring apparatus having a small number of pin electronic elements 17 cannot be used. In such a case, either pin-electronic elements 17 have to be added to the apparatus or a large measuring apparatus having a large number of pin-electronic elements 17 has to be employed.

Especially, when a plurality of IC are tested at one time in-order to improve measuring efficiency, at least as many pin-electronic elements as the total number of the external leads are required since all the external leads of the ICs have to be connected to pin-electronic elements in one-to-one relationship. Inevitably, measuring apparatus becomes large. For example, when four IC each of which has sixty-four external leads are to be tested at one time, 256 (4×64) pin electronic elements are needed.

SUMMARY OF THE INVENTION

It is an object of the present invention to solve the above problems by providing a measuring method for testing ICs in which ICs having a large number of external leads can be tested with a small number of pin-electronic elements provided in a measuring apparatus.

A measuring method for testing ICs according to the present invention comprises the steps of: positioning ICs each including a plurality circuit blocks each circuit block having a distinct function; selecting one of the plurality of circuit blocks from each of the plurality of ICs, each of the plurality of circuit blocks having a different function; testing the selected circuit blocks simultaneously; measuring the test results from each of the selected circuit blocks with a measuring unit; selecting one of the plurality of circuit blocks from each of the plurality of ICs such that the circuit block selected from a first one of the plurality of ICs, in the first selecting step has a different function than the circuit block selected from the first one of the plurality of ICs in this step; testing the circuit blocks selected in the preceding step simultaneously; and measuring test results for each of the circuit blocks tested in the previous testing step.

In such a measuring method, one circuit block is selected from each of the ICs so that all the selected circuit blocks are different from one another, and each of the selected blocks is tested and the test result is measured by the measuring unit. Then, the circuit-block selection in each of the ICs is shifted, so that a circuit block different from the previously selected one in each of the ICs is tested and each test result is measured.

DESCRIPTION OF THE PREFERRED EMBODIMENTS

Embodiments of the present invention will be described hereinafter with reference to the drawings.

Figure 1:
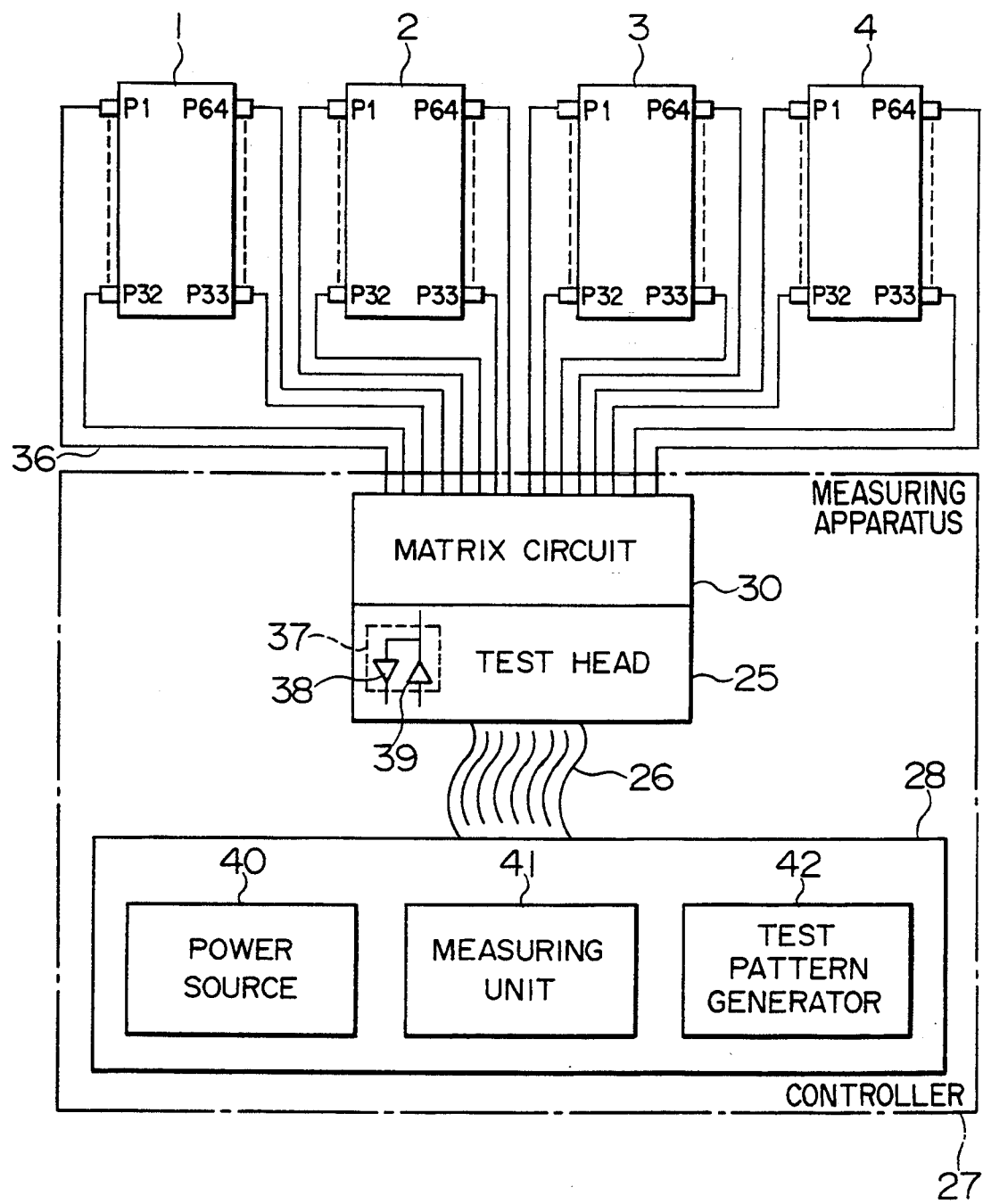
FIG. 1 is a block diagram of a measuring apparatus, illustrating practice of a measuring method in testing ICs according to an embodiment of the present invention.

Referring to FIG. 1, a measuring apparatus 27 comprises a controller 28, a test head 25 which is connected to the controller 28 by cables 26, and a matrix circuit 30 which is provided on the test head 25. The controller 28 includes a power source 40, a measuring unit 41 and a test pattern generator 42. The test head 25 includes at least sixty-four pin-electronic elements 37 each of which has a comparator 38 and a driver 39.

Figure 2:
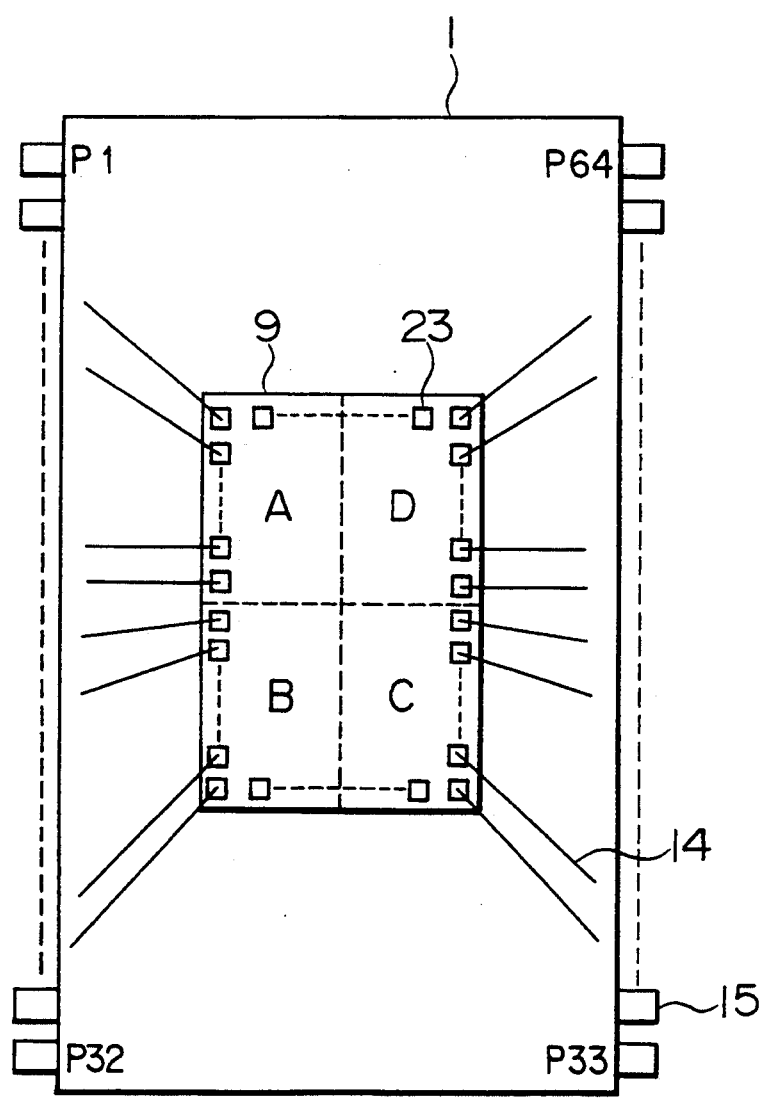
FIG. 2 is a schematic view of an IC to which a measuring method according to the present invention is applied.

As shown in FIG. 2, an IC 1 to be tested has a chip 9 and sixty-four (P1 to P64) external leads 15 which are connected to electrodes 23 on the chip 9 by Ag wires 14. The chip 9 is functionally divided into four circuit blocks A to D. Thus, in the case where only one of the circuit blocks is to be tested, there is no need to use all the sixty-four external leads 15, but, for example, only about a quarter of the Sixty-four external leads 15 are needed for the test. The other ICs 2, 3 and 4 shown in FIG. 1 have the same construction as the IC 1.

Figure 3:
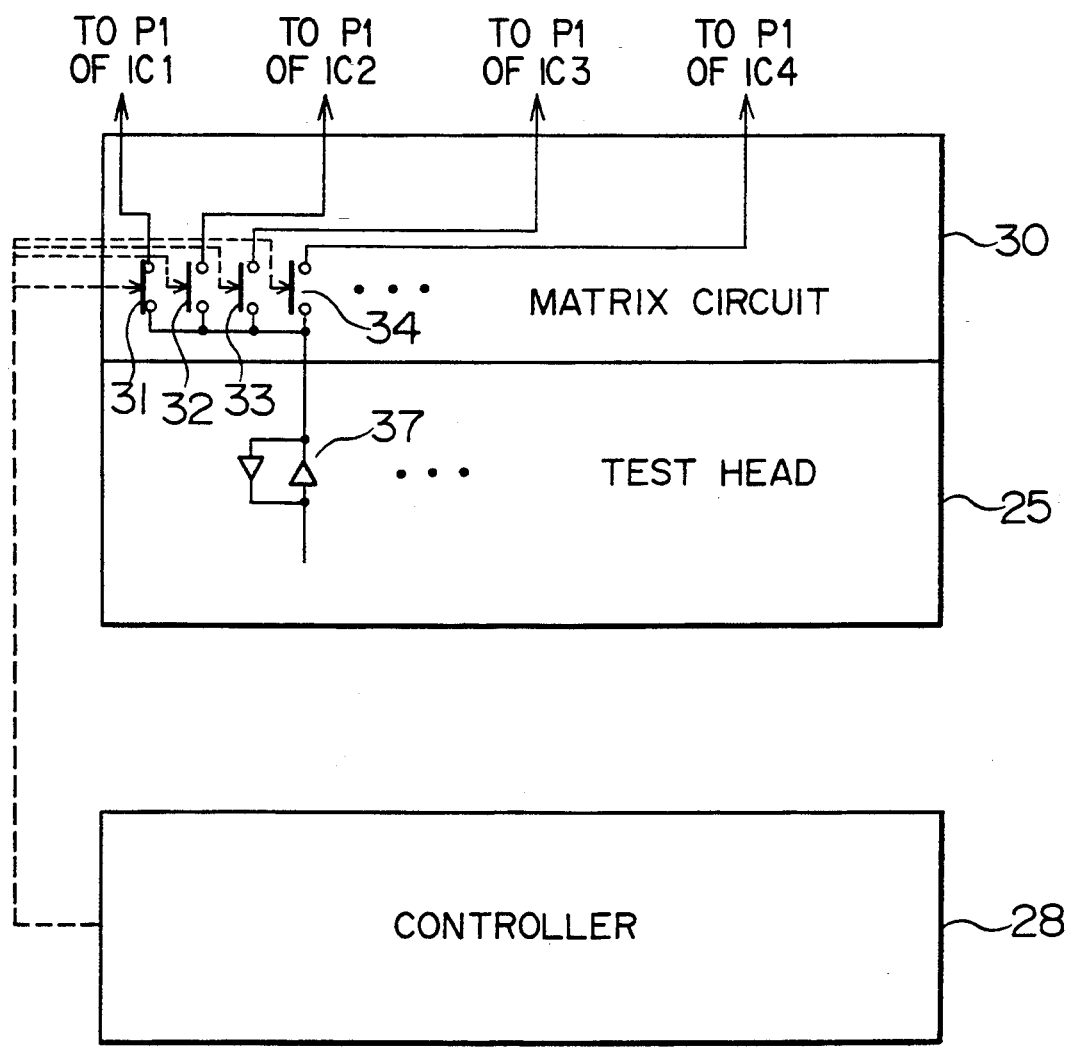
FIG. 3 is a schematic view of the measuring apparatus shown in FIG. 1, illustrating the interior construction thereof.

The external leads 15 of these ICs 1 to 4 are connected to the matrix circuit 30 of the measuring apparatus 27. As shown in FIG. 3, the matrix circuit 30 includes at least 256 switches which are controlled by the controller 28. Each of the external leads 15 is connected to its corresponding switch. For example, the external leads P1 of the ICs 1 to 4 are connected to the switches 31 to 34 respectively, at one of the two terminals of each switch. The set of switches 31 to 34 is connected at each of the Other terminals to a single pin-electronic element 37. The controller 28 selects one of the switches 31 to 34 to be on, and keeps the other switches off. In FIG. 3, a switch 31 is on, selectively connecting the external lead P1 of the IC 1 to its corresponding pin-electronic element 37.

Figure 4:
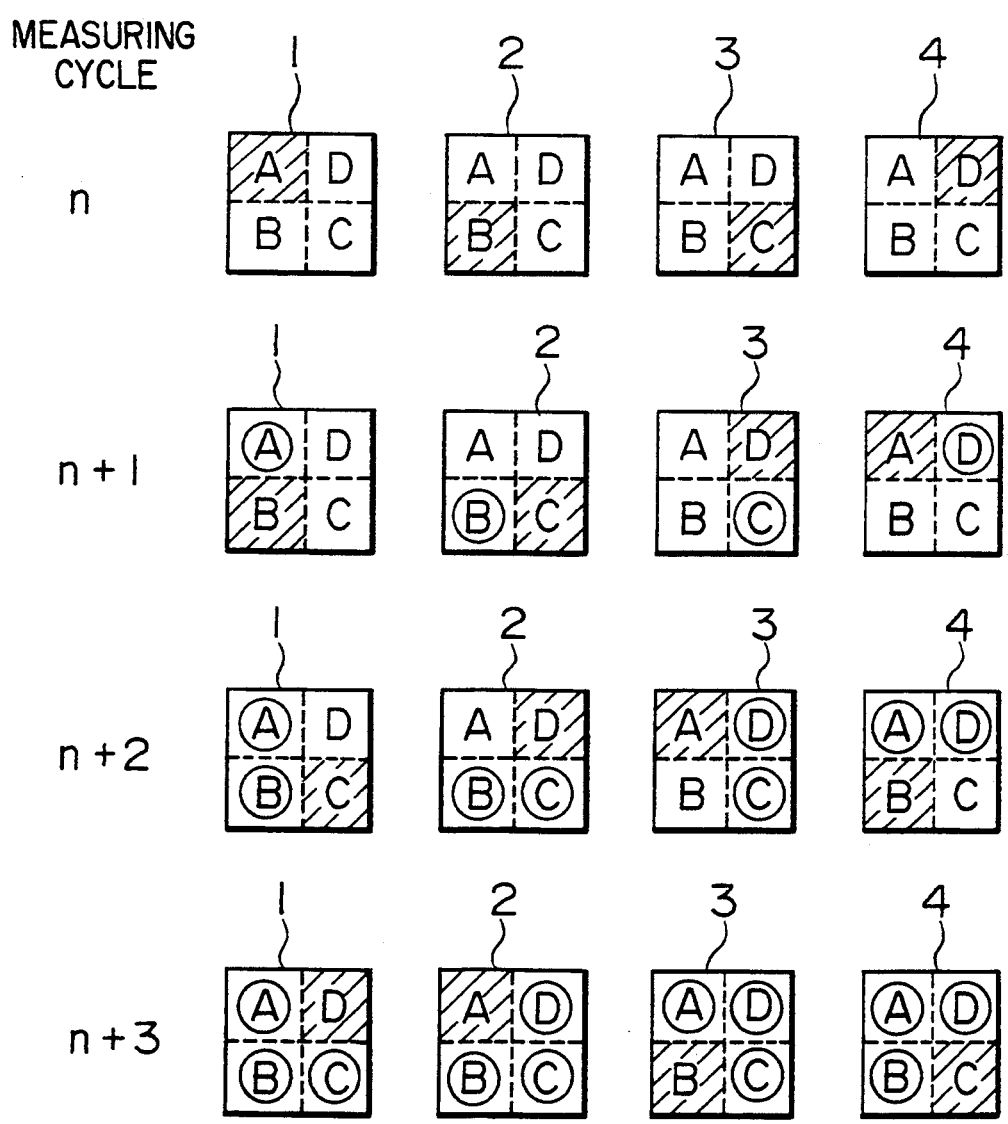
FIG. 4 is a conceptual diagram of a measuring method according to the first embodiment of the present invention.

With reference to FIG. 4, a measuring method according to the present invention will be described. The ICs 1 to 4 to be tested are placed in position. The controller 28 of the measuring apparatus 27 controls the matrix circuit 30 so tat one of the circuit blocks A to D is selected in each of the ICs 1 to 4, with the selected circuit Blocks being all different from one another. In the figure, the shadowed circuit blocks are selected by the matrix circuit 30. During one measuring cycle n, in the IC 1, only the external leads 15 which are necessary for testing the circuit block A are electrically connected to their corresponding pin-electronic elements 37 of the the test head 25, and the other external leads 15, which are not necessary for testing the circuit block A, are held at a predetermined electric potential. In the other ICs 2, 3 and 4, only the external leads 15 which are necessary for testing the circuit blocks B, C and D respectively are electrically connected to their corresponding pin-electronic elements 37 of the the test head 25, and the other external leads 15 are held at a predetermined electric potential.

In such a state, the measuring apparatus 27 tests the ICs. A power source 40 in the controller 28 supplies power through the cables 26, the test head 25 and the cable 36 to power-receiving external leads 15 of each of the ICs 1 to 4. Then, the test pattern generator 42 in the controller 28 sends Hi-level and Lo-level signals to the external leads 15 which are necessary for testing the selected circuit blocks A to D. The output signals from the ICs 1 to 4 are measured by the measuring unit 41 in the controller 28.

In the next cycle n+1, the circuit block selection in each of the ICs 1 to 4 is shifted, so that the circuit blocks B, C, D, A are selected in the ICs 1, 2, 3, 4 respectively. The ICs stay in the same position. The selected circuit blocks are tested in the same manner as in the measuring cycle n. In the figure, the circled letters indicate that the circuit blocks have been tested.

In the next cycle n+2, the circuit blocks C, D, A, B of the ICs 1, 2, 3, 4 respectively are tested. In the cycle n+3, the blocks D, A, B, C of the ICs 1, 2, 3, 4 are tested.

When the four cycles n to n+3 are finished, each of the ICs 1 to 4 has had all the circuit blocks A to D tested. Then, the ICs are determined good or no-good according to the test results on all the blocks A to D compared with the standards.

The above serial tests are carried out by a test program stored in the measuring apparatus 27. The test program includes a portion which carries out the test on the circuit blocks A to D of a desired IC and another portion which carries out the controlling of the matrix circuit 30 so that the matrix circuit 30 selects different circuit blocks in different ICs and which carries out the shifting of the circuit block selections in every cycle.

According to this embodiment, since the matrix circuit 30 selects one of the blocks A to D to be tested in each of four ICs 1 to 4 in one cycle, the four ICs having 256 (4×64) external leads 15 can be tested at one time with the test head 25 which has only about sixty-four pin-electronic elements 37. The time required for testing one IC is substantially the same in the conventional art, in which an IC to be tested has all the external leads connected to pin-electronic elements. Also, in the conventional method, external leads are selected to conduct signals to the IC for each of different tests and then the output signals from the IC are measured.

Though the matrix circuit 30 is provided on the test head 25, a similar matrix circuit 30 may be provided inside the test head 25.

A measuring method according to another embodiment of the present invention will be described with reference to FIG. 5. In this embodiment, a matrix circuit is not used, but ICs 1 to 4 are changed in position in order to shift the circuit block selection. First through fourth IC sockets (not illustrated in the drawings) for receiving ICs are connected to a test head 25. The first IC socket connects only the external leads which are necessary for testing a circuit block A of the IC received thereby to corresponding pin-electronic elements 37 of the test head 25. In the same manner, the second, third and fourth IC sockets connect only the external leads necessary for testing circuit blocks B, C and D to their corresponding pin-electronic elements 37, respectively.

Figure 5:
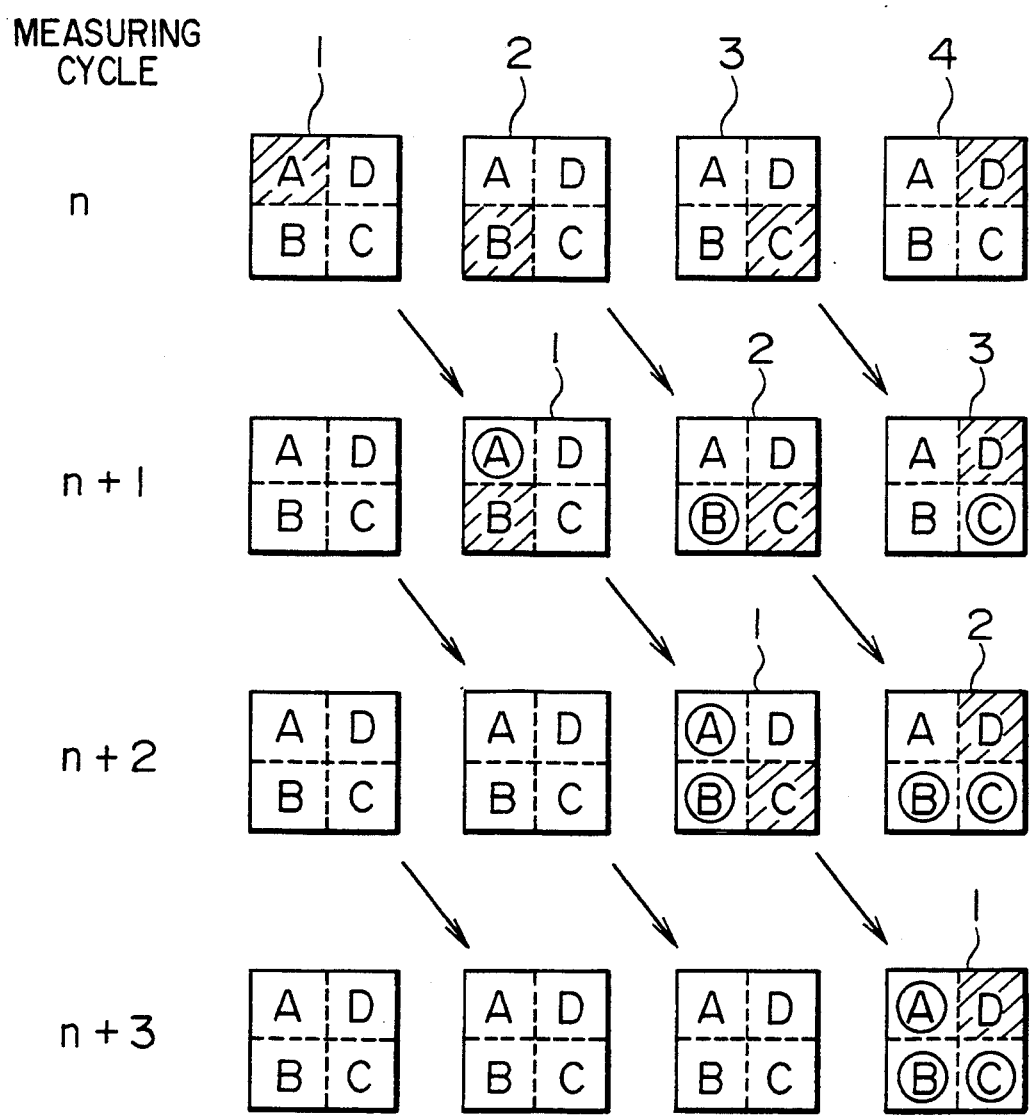
FIG. 5 is a conceptual diagram of a measuring method according to the second embodiment of the present invention.
Figure 6:
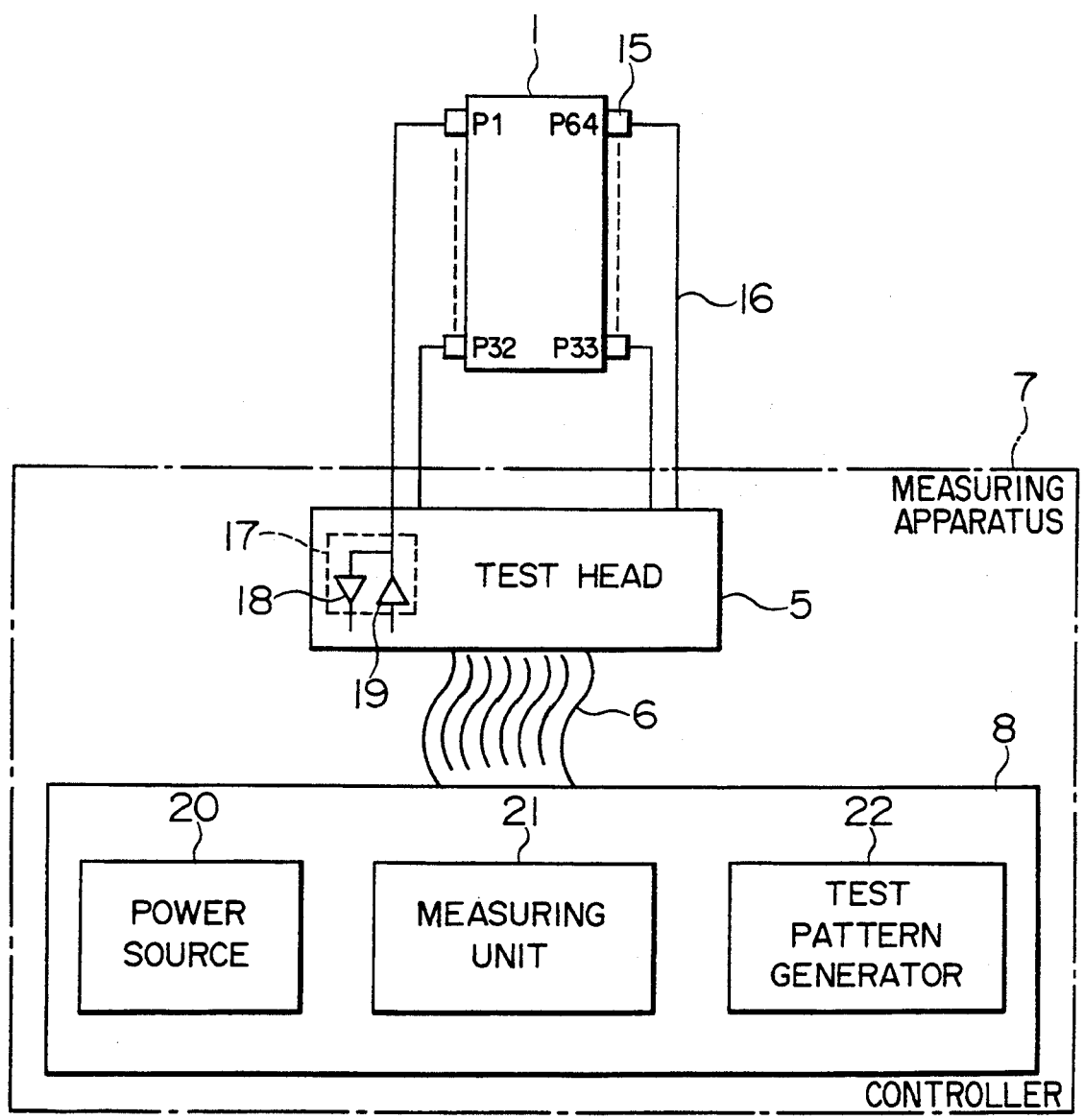
FIG. 6 is a block diagram of a conventional measuring apparatus in testing ICs.

Therefore, when the ICs 1 to 4 are connected to the first through fourth IC sockets, the circuit blocks shadowed in FIG. 5 are tested in a cycle n. After the test results are measured, the ICs 1, 2 and 3 are shifted to the next IC sockets, i.e. the second, third and fourth IC sockets respectively. The first IC socket receives a new IC. Thus, the ICs 1 to 3 have the external leads necessary for testing the circuit blocks B to D connected to their corresponding pin-electronic elements 37 respectively. Then, these circuit blocks are tested, as shown in a cycle In such a method where ICs are shifted to the next sockets after every cycle as described above, four cycles from the beginning completes the tests on one IC, and after that, the tests are completed for another IC in every cycle.

An IC socket may be formed so that an IC is inserted therein, or may be formed of connecting pins which connect to the external leads of an IC.

In the above embodiments, four ICs are tested at a time since the IC to be tested has the four circuit blocks A to D which can be functionally separated. If the number of such circuit blocks of an IC is other than four, as there are many ICs as such circuit blocks will be tested at a time.

What is claimed is:

1. An IC measuring method comprising the steps of:
   (a) positioning a plurality of ICs, each including a plurality of circuit blocks each circuit block having a distinct function;
   (b) selecting one of the plurality of circuit blocks from each of the plurality of ICs, each of the selected circuit blocks having a different function;
   (c) testing the selected circuit blocks simultaneously;
   (d) measuring test results for each of the selected first circuit blocks;
   (e) selecting one of the plurality of circuit blocks from each of the plurality of ICs such that the circuit block selected from a first one of the plurality of ICs in step.(b) has a different function than the circuit block selected from the first one of the plurality of ICs in step (e);

(f) testing the circuit blocks selected in step (e) simultaneously; and (g) measuring test results for each of the circuit blocks tested in step (f).

2. An IC measuring method according to claim 1 wherein the selection of the circuit blocks in step (b) is determined by the respective positions of the plurality of ICs, the circuit blocks selected in step (e) being selected by shifting the positions of the plurality of ICs.

3. An IC measuring method according to claim 1 including selecting circuit blocks in each of the ICs with a matrix circuit provided in a measuring apparatus without shifting the positions of the plurality of ICs.

4. An IC testing method comprising the steps of:

selecting a plurality of ICs, each IC including a plurality of circuit blocks;

positioning the plurality of ICs according to a predetermined pattern;

selecting a circuit block from each of the plurality of ICs to form a first circuit block group;

testing the circuit blocks of the first circuit block group simultaneously by applying signals to the circuit blocks of the first circuit block group;

measuring the level of signals output from the ICs responsive to the signals applied to the first circuit block group;

selecting a circuit block from each of the plurality of ICs to form a second circuit block group; and repeating said testing and measuring steps on each of the circuit blocks of the second circuit block group;

5. An IC measuring method according to claim 4 wherein the selection of the circuit blocks comprising the first circuit block group is determined by the respective positions of the ICs, the circuit blocks of the second circuit block group being selected by shifting the positions of the plurality of ICs;

6. An IC measuring method according to claim 4 including the step of selecting circuit blocks in each of the ICs with a matrix circuit to form the first and second circuit block groups without shifting the positions of the plurality of ICs.

* * * * *

UNITED STATES PATENT AND TRADEMARK OFFICE
CERTIFICATE OF CORRECTION

PATENT NO. :   5,386,189
DATED      :   January 31, 1995
INVENTOR(S):   Nishimura et al.

It is certified that error appears in the above-indentified patent and that said Letters Patent is hereby corrected as shown below:

Column 6, Line 11, change ";" to --.--;

Line 17, change ";" to --.--.

Signed and Sealed this

Thirteenth Day of June, 1995

Attest:

BRUCE LEHMAN

*Attesting Officer*            *Commissioner of Patents and Trademarks*